(12) United States Patent
Hong

(10) Patent No.: US 7,851,847 B2
(45) Date of Patent: Dec. 14, 2010

(54) FLASH MEMORY DEVICE AND METHOD OF ERASING THE SAME

(75) Inventor: Young-Ok Hong, Icheon-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 713 days.

(21) Appl. No.: 11/748,137

(22) Filed: May 14, 2007

(65) Prior Publication Data

US 2008/0157173 A1 Jul. 3, 2008

(30) Foreign Application Priority Data

Dec. 27, 2006 (KR) .............. 10-2006-0134870

(51) Int. Cl.
*H01L 29/792* (2006.01)

(52) U.S. Cl. .............. 257/324; 257/406; 257/411; 257/E21.423; 257/E29.155; 257/E29.309; 438/287; 438/288; 438/591; 438/592

(58) Field of Classification Search .............. 257/324, 257/407, E29.308, E21.423, 406, 411, E29.128, 257/E29.155, E29.309; 438/216, 261, 287–288, 438/591, 592

See application file for complete search history.

(56) References Cited

U.S. PATENT DOCUMENTS 6,133,603 A * 10/2000 Nomoto ............... 257/315
6,304,484 B1 * 10/2001 Shin et al. .............. 365/185.03
6,630,383 B1 10/2003 Ibok et al.
6,737,320 B2 * 5/2004 Chen et al. .............. 438/257
6,818,944 B2 * 11/2004 Lee .............. 257/324
2004/0227179 A1 11/2004 Rabkin et al.

FOREIGN PATENT DOCUMENTS

| JP | 10-289957 | 10/1998 |
|---|---|---|
| KR | 1020020044262 | 6/2002 |
| KR | 1020050002308 | 1/2005 |
| KR | 1020050073362 | 7/2005 |
| KR | 1020060100995 | 9/2006 |

* cited by examiner

Primary Examiner—Mary Wilczewski
Assistant Examiner—Toniae M Thomas
(74) Attorney, Agent, or Firm—Lowe Hauptman Ham & Berner LLP

(57) ABSTRACT

A flash memory device includes a tunnel insulating layer formed over a semiconductor substrate, a charge trap layer formed over the tunnel insulating layer and configured to trap electric charges, a blocking insulating layer formed over the charge trap layer, and a gate electrode formed over the blocking insulating layer and including a first conductive layer and a second conductive layer doped with N and P impurities respectively. Further, a method of erasing a flash memory device includes providing a flash memory device including a gate electrode having a first conductive layer and a second conductive layer doped with N and P impurities respectively, and performing an erase operation in a state where a thickness of a depletion layer at an interface of a PN junction comprising the first conductive layer and the second conductive layer is increased due to a negative potential bias applied to the gate electrode.

17 Claims, 2 Drawing Sheets

FLASH MEMORY DEVICE AND METHOD OF ERASING THE SAME

CROSS-REFERENCES TO RELATED APPLICATIONS

The present application claims priority to Korean patent application number 10-2006-134870, filed on Dec. 27, 2006, which is incorporated by reference in its entirety.

BACKGROUND OF THE INVENTION

The present invention relates, in general, to flash memory devices and, more particularly, to a flash memory device and a method of erasing the same, in which backward tunneling charges can be reduced at the time of an erase operation.

In a method of storing data by using a polysilicon layer, used in a flash memory device, as a floating gate, a line width is miniaturized as memory becomes high integrated, and capacitance occurs. Accordingly, there are problems in which the speed and stability of products are lowered.

In recent years, to overcome the shortcomings of the flash memory device, active research has been done on Silicon-Oxide-Nitride-Oxide-Silicon (SONOS) flash memory.

The SONOS flash memory generally has a structure in which an oxide layer, a nitride layer, an oxide layer and a polycrystalline silicon layer are sequentially stacked over a semiconductor substrate. The nitride layer has an ONO structure in which it is sandwiched between the oxide layers. In the ONO structure, the nitride layer is used as an electric charge-trapping medium. The electric charge trapping medium is a place for storing information of the SONOS flash memory. Thus, the nitride layer is a structure having a similar function as that of a floating gate of typical flash memory.

If an erase operation is performed by using the SONOS flash memory constructed above, an electric field, generated by voltage applied to a control gate, is transferred to a tunnel-insulating layer through a blocking oxide layer.

If the thickness of the blocking oxide layer is more, however, an electric field transferred to the tunnel-insulating layer is weakened at the time of the erase operation, so that the program speed is decreased. Meanwhile, if the thickness of the blocking oxide layer is less, the program speed is increased and backward tunneling charges are also increased and hence the electric charges of the control gate are trapped at the nitride layer through the blocking oxide layer. Due to this, the flash memory device may operate inefficiently.

SUMMARY OF THE INVENTION

Accordingly, the present invention addresses the above problems, and discloses a flash memory device and a method of erasing the same, in which a first conductive layer doped with N impurity and a second conductive layer doped with P impurity are formed over a blocking oxide layer and the thickness of a depletion layer between the first and second conductive layers is increased at the time of an erase operation, so that backward tunneling charges can be reduced at the time of the erase operation.

According to an aspect of the present invention, there is provided a flash memory device, including a tunnel insulating layer formed over a semiconductor substrate, a charge trap layer formed over the tunnel insulating layer, a blocking insulating layer formed over the charge trap layer, and a gate electrode formed over the blocking insulating layer and including a first conductive layer doped with N impurity and a second conductive layer doped with P impurity.

According to another aspect of the present invention, there is provided a method of erasing a flash memory device, including the steps of providing a flash memory device including a gate electrode having a first conductive layer doped with N impurity and a second conductive layer doped with P impurity, and performing an erase operation in a state where a thickness of a depletion layer formed at an interface of a PN junction comprising the first conductive layer and the second conductive layer is increased by means of a negative potential bias applied to the gate electrode.

DESCRIPTION OF SPECIFIC EMBODIMENTS

Now, a specific embodiment according to the present invention will be described with reference to the accompanying drawings.

Figure 1:
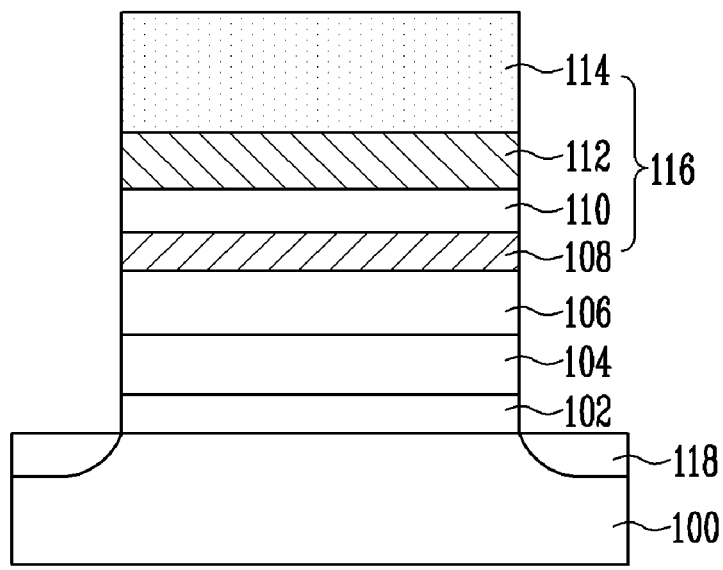
FIG. 1 is a cross-sectional view of a flash memory device according to an embodiment of the present invention.

FIG. 1 is a cross-sectional view of a flash memory device according to an embodiment of the present invention.

The flash memory device includes a tunnel-insulating layer 102, a charge trap layer 104, a blocking insulating layer 106, a gate electrode 116 and a source/drain 118 all of which are formed over a semiconductor substrate 100. The tunnel-insulating layer 102 can be formed of oxide. The blocking insulating layer 106 can be formed of oxide, preferably High Temperature Oxide (HTO). The blocking insulating layer 106 can also be formed of high dielectric material, such as $Al_2O_3$. The charge trap layer 104 can be formed using a nitride layer. A tantalum nitride (TaN) layer and a titanium nitride (TiN) layer can be formed between the blocking insulating layer 106 and the gate electrode 116.

The gate electrode 116 is formed over the blocking insulating layer 106, and includes a first conductive layer 108 doped with N impurity and a second conductive layer 112 doped with P impurity. The first conductive layer 108 doped with N impurity can be formed by using a polysilicon layer doped with N type impurity of 1E20 atoms/cm$^3$ to 4E20 atoms/cm$^3$, or phosphor (P) of N type impurity. The second conductive layer 112 doped with P impurity can be formed by using a polysilicon layer doped with P type impurity of 1E20 atoms/cm$^3$ to 4E20 atoms/cm$^3$, or boron (B) of P type impurity.

A depletion layer 110 is formed between the first conductive layer 108 doped with N impurity and the second conductive layer 112 doped with P impurity. A third conductive layer 114 may be further formed over the second conductive layer 112 doped with P impurity. The third conductive layer 114 can be formed of tungsten silicide (WSix) or tungsten (W). Consequently, the gate electrode 116 has a stack structure of the first conductive layer 108 doped with N impurity, the second conductive layer 112 doped with P impurity and the third conductive layer 114.

Figure 2:
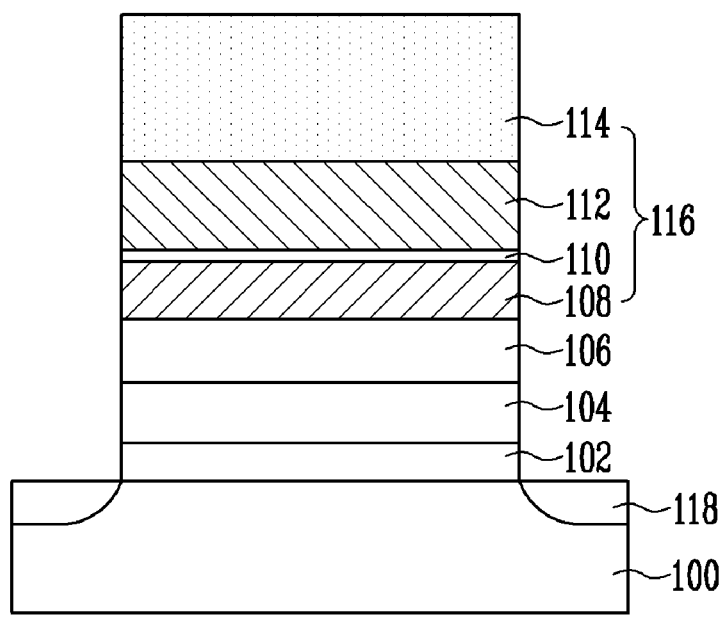
FIG. 2 is a cross-sectional view illustrating a phenomenon appearing at the time of a program operation of the flash memory device illustrated in FIG. 1.

FIG. 2 is a cross-sectional view illustrating a phenomenon appearing at the time of a program operation of the flash memory device illustrated in FIG. 1.

If a positive bias is applied to the gate electrode 116 at the time of the program operation, the depletion layer 110 between the first conductive layer 108 doped with N impurity and the second conductive layer 112 doped with P impurity almost disappears. As described above, a phenomenon in which a forward bias seems to be applied to the PN junction comprising the first conductive layer 108 doped with N impurity and the second conductive layer 112 doped with P impurity occurs. Thus, the bias applied to the gate electrode 116 is transferred to the blocking insulating layer 106 without change. Accordingly, the program operation can be performed normally.

Figure 3:
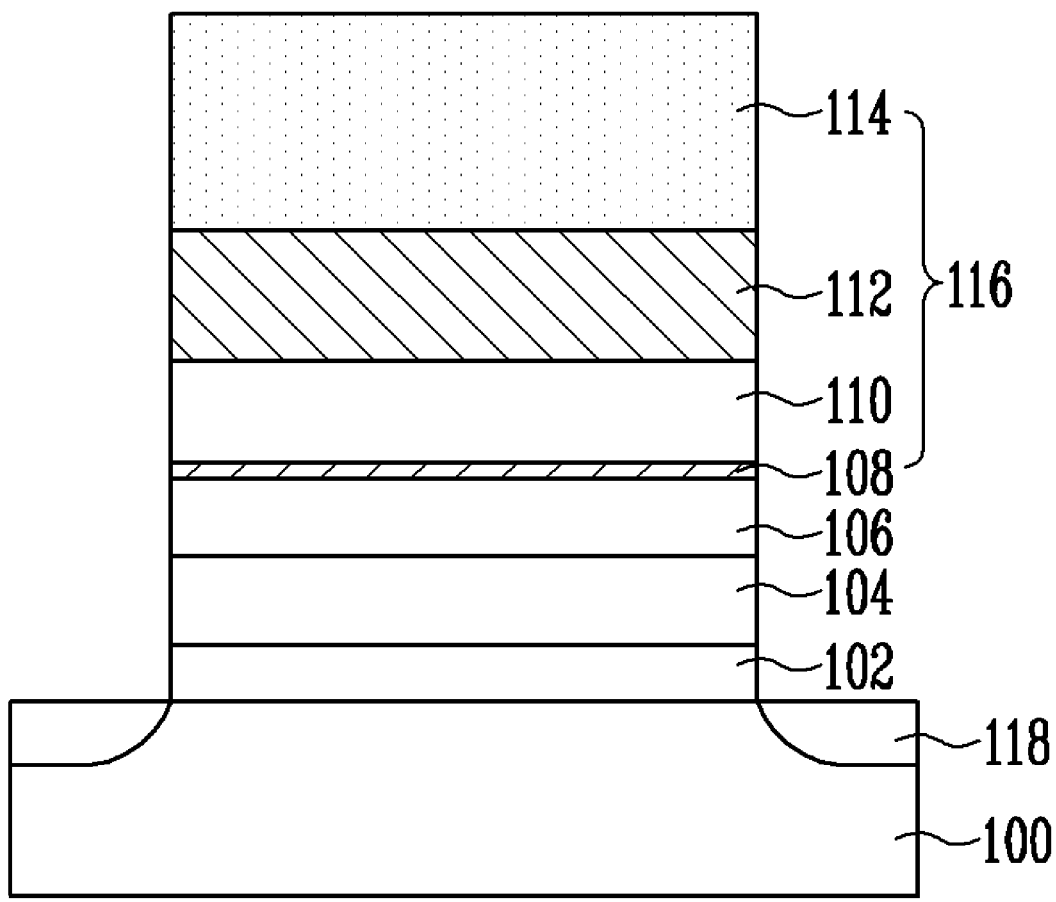
FIG. 3 is a cross-sectional view illustrating a phenomenon appearing at the time of an erase operation of the flash memory device illustrated in FIG. 1.

FIG. 3 is a cross-sectional view illustrating a phenomenon appearing at the time of an erase operation of the flash memory device illustrated in FIG. 1.

If a negative bias is applied to the gate electrode 116 at the time of the erase operation, a backward bias is applied to the PN junction in the PN diode. As if the thickness of the depletion layer 110 increases, the thickness of the depletion layer 110 is increased between the first conductive layer 108 doped with N impurity and the second conductive layer 112 doped with P impurity by means of the negative bias.

If the thickness of the depletion layer 110 increases as described above, the Effective Field Height (EFH) of the blocking insulating layer 106 is increased. If the EFH of the blocking insulating layer 106 is increased, backward tunneling charges can be decreased. Therefore, electric charges of the gate electrode 116 are not trapped at the charge trap layer 104 through the blocking insulating layer 106 at the time of the erase operation, so that the erase operation can be performed normally. Further, since the blocking insulating layer 106 can be formed thinly compared with the prior art, the program speed can be improved.

As described above, the present invention can have the following advantages.

First, a first conductive layer doped with N impurity and a second conductive layer doped with P impurity are formed over a blocking oxide layer and the thickness of a depletion layer between the first and second conductive layers is increased at the time of an erase operation. Thus, the EFH of the blocking insulating layer can be increased.

Second, backward tunneling charges can be decreased by efficiently reducing the thickness of the blocking insulating layer.

Third, as backward tunneling charges are decreased, electric charges of the gate electrode are not trapped at the charge trap layer through the blocking insulating layer. Accordingly, an erase operation can be performed correctly.

Fourth, since the blocking insulating layer can be formed with a lesser thickness as compared with the prior art, the program speed can be improved.

Although the foregoing description has been made with reference to the specific embodiment, it is to be understood that changes and modifications of the present invention may be made by the ordinary skilled in the art without departing from the spirit and scope of the present invention and appended claims.

What is claimed is:

1. A flash memory device, comprising:
   a tunnel insulating layer formed over a semiconductor substrate;
   a charge trap layer formed over the tunnel insulating layer;
   a blocking insulating layer formed over the charge trap layer; and
   a gate electrode formed over the blocking insulating layer and including a first conductive layer doped with N impurity and a second conductive layer doped with P impurity.

2. The flash memory device of claim 1, further comprising a depletion layer formed between the first conductive layer doped with N impurity and the second conductive layer doped with P impurity.

3. The flash memory device of claim 2, wherein the gate electrode includes the first conductive layer doped with N impurity, formed over a lower side of the depletion layer, and the second conductive layer doped with P impurity, formed over an upper side of the depletion region.

4. The flash memory device of claim 1, wherein the gate electrode further comprises a metal silicide layer or metal and combination thereof.

5. The flash memory device of claim 1, wherein the gate electrode further comprises a tungsten silicide layer or tungsten and combination thereof.

6. The flash memory device of claim 1, wherein the charge trap layer is formed of a nitride layer.

7. The flash memory device of claim 1, wherein the blocking insulating layer is formed of oxide.

8. The flash memory device of claim 1, wherein the blocking insulating layer is formed of High Temperature Oxide (HTO), or $Al_2O_3$ which is a high dielectric material.

9. The flash memory device of claim 1, further comprising a tantalum nitride (TaN) layer and a titanium nitride (TiN) layer formed between the blocking insulating layer and the gate electrode.

10. The flash memory device of claim 1, wherein the first conductive layer is formed of a polysilicon layer doped with N type impurity of 1E20 atoms/$cm^3$ to 4E20 atoms/$cm^3$.

11. The flash memory device of claim 1, wherein the second conductive layer is formed of a polysilicon layer doped with P type impurity of 1E20 atoms/$cm^3$ to 4E20 atoms/$cm^3$.

12. The flash memory device of claim 2, wherein at the time of a program operation, a thickness of the depletion layer is decreased by means of positive voltage applied to the second conductive layer.

13. The flash memory device of claim 2, wherein at the time of an erase operation, a thickness of the depletion layer is increased by means of negative voltage applied to the second conductive layer.

14. A flash memory device, comprising:
   a tunnel insulating layer formed over a semiconductor substrate;
   a charge trap layer formed over the tunnel insulating layer;
   a blocking insulating layer formed over the charge trap layer; and
   a gate electrode formed over the blocking insulating layer and including a first conductive layer doped with N impurity a second conductive layer doped with P impurity and a third conductive layer.

15. The flash memory device according to claim 14, wherein the third conductive layer is formed above the second conductive layer and is a tungsten silicide or tungsten.

16. The flash memory device of claim 14, further comprising a depletion layer formed between the first conductive layer doped with N impurity and the second conductive layer doped with P impurity.

17. The flash memory device of claim 16, wherein the gate electrode includes the first conductive layer doped with N impurity, formed over a lower side of the depletion layer, and the second conductive layer doped with P impurity, formed over an upper side of the depletion region.

* * * * *